United States Patent
Kuramochi et al.

(10) Patent No.: US 9,418,771 B2
(45) Date of Patent: Aug. 16, 2016

(54) COMPLEX OXIDE SINTERED BODY, SPUTTERING TARGET, TRANSPARENT CONDUCTIVE OXIDE FILM, AND METHOD FOR PRODUCING SAME

(71) Applicant: TOSOH CORPORATION, Yamaguchi (JP)

(72) Inventors: Hideto Kuramochi, Kanagawa (JP); Kimiaki Tamano, Kanagawa (JP); Hitoshi Iigusa, Kanagawa (JP); Ryo Akiike, Kanagawa (JP); Tetsuo Shibutami, Kanagawa (JP)

(73) Assignee: TOSOH CORPORATION, Yamaguchi (JP)

( * ) Notice: Subject to any disclaimer, the term of this patent is extended or adjusted under 35 U.S.C. 154(b) by 144 days.

(21) Appl. No.: 14/361,455

(22) PCT Filed: Nov. 29, 2012

(86) PCT No.: PCT/JP2012/080953
§ 371 (c)(1),
(2) Date: May 29, 2014

(87) PCT Pub. No.: WO2013/084795
PCT Pub. Date: Jun. 13, 2013

(65) Prior Publication Data
US 2014/0332735 A1  Nov. 13, 2014

(30) Foreign Application Priority Data
Dec. 7, 2011  (JP) .................. 2011-267871

(51) Int. Cl.
*H01B 1/08* (2006.01)
*C04B 35/01* (2006.01)
(Continued)

(52) U.S. Cl.
CPC  *H01B 1/08* (2013.01); *C04B 35/01* (2013.01); *C04B 35/6262* (2013.01); *C23C 14/083* (2013.01); *C23C 14/086* (2013.01); *C23C 14/34* (2013.01); *C23C 14/3414* (2013.01); *H01J 37/3429* (2013.01); *C04B 2235/3225* (2013.01); *C04B 2235/3244* (2013.01); *C04B 2235/3286* (2013.01); *C04B 2235/549* (2013.01); *C04B 2235/5445* (2013.01); *C04B 2235/6562* (2013.01); *C04B 2235/6565* (2013.01);
(Continued)

(58) Field of Classification Search
CPC ............ H01B 1/00; H01B 1/08; C04B 35/48; C23C 14/34
See application file for complete search history.

(56) References Cited

FOREIGN PATENT DOCUMENTS

| JP | 05-070942 | 3/1993 |
|---|---|---|
| JP | 06-340473 | 12/1994 |

(Continued)

OTHER PUBLICATIONS

English language machine translation of JP 05-070942A (pub date Mar. 1993).*
(Continued)

*Primary Examiner* — Mark Kopec
(74) *Attorney, Agent, or Firm* — Greenblum & Bernstein, P.L.C.

(57) ABSTRACT

The present invention provides a complex oxide sintered body 10 wherein Zr/(In+Zr+Y) is 0.05 to 4.5 at % and Y/(In+Zr+Y) is 0.005 to 0.5 at % in an atomic ratio when indium, zirconium, and yttrium are designated by In, Zr, and Y, respectively. Moreover, the present invention provides a sputtering target including the complex oxide sintered body 10 and a transparent conductive oxide film obtained by sputtering the sputtering target.

12 Claims, 1 Drawing Sheet

(51) Int. Cl.
  *C04B 35/626* (2006.01)
  *C23C 14/08* (2006.01)
  *C23C 14/34* (2006.01)
  *H01J 37/34* (2006.01)

(52) U.S. Cl.
  CPC . *C04B2235/6567* (2013.01); *C04B 2235/6585* (2013.01); *C04B 2235/6586* (2013.01); *C04B 2235/77* (2013.01); *C04B 2235/786* (2013.01)

(56) References Cited

FOREIGN PATENT DOCUMENTS

| JP | 09-209134 | 8/1997 |
| JP | 2002-226966 | 8/2002 |
| JP | 2006213964 A * | 2/2005 |
| JP | 2007-273455 | 10/2007 |
| WO | 2010/032432 | 3/2010 |

OTHER PUBLICATIONS

International Preliminary Report on Patentability issued Jun. 10, 2014 in English in PCT/JP2012/080953.
"The Effect of Sno2 Concentration on the Electrical and optial properties of In2O3—SnO2 Films", TOSOH Research & Technology Review, 2003, pp. 11.
International Search Report in PCT/JP2012/080953 on Mar. 5, 2013.
Takashi Koida et al., Characterization of transparent conductive Zr-doped In2O3, 2007, p. 663 with partial English translation.
Liang Yuan-Chang et al., "Physical properties of low temperature sputtering-deposited zirconium-doped indium oxide films at various oxygen partial pressures", Applied Physics. A. Materials Science & Processing 2009, vol. 97, p. 249-255.

* cited by examiner

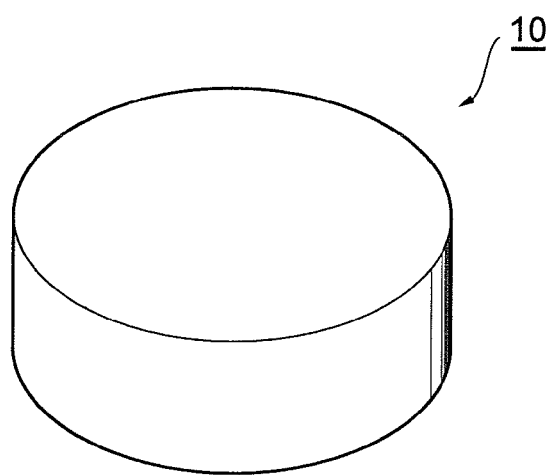

COMPLEX OXIDE SINTERED BODY, SPUTTERING TARGET, TRANSPARENT CONDUCTIVE OXIDE FILM, AND METHOD FOR PRODUCING SAME

TECHNICAL FIELD

The present invention relates to a complex oxide sintered body, a sputtering target, a transparent conductive oxide film, and a method for producing the same.

BACKGROUND ART

Transparent conductive oxide films have low resistance and relatively high transmittance in the region of visible light. For this reason, these transparent conductive oxide films are used for electrodes for liquid crystal displaying elements and a variety of light receiving elements in solar cells, for example. The transparent conductive oxide films are also used in various fields such as heat ray reflective films or antistatic films for automobiles and construction materials or transparent heating bodies for preventing fogging of freezing display cases. Among these, indium oxide films to which tin is added are widely used as ITO films.

In recent years, a technique of reducing light absorption properties has become extremely important as a means for exploiting the full potential of the properties of the elements. Particularly, in applications for which the optical properties are important, such as the electrode for the liquid crystal displaying element and the electrode for a variety of light receiving elements in the solar cell, an electrode having lower light absorption properties over a wide region of wavelength is demanded.

In the ITO film above, adjustment of the light absorption properties has been attempted by adjusting the amount of tin to be added. However, it is difficult to improve both resistance and light absorption properties by this method. For example, Non Patent Literature 1 discloses dependency of electro-optical properties of a transparent conductive $In_2O_3$—$SnO_2$ film on the amount of $SnO_2$. According to this, the resistance of the transparent conductive $In_2O_3$—$SnO_2$ film is the lowest at an amount of $SnO_2$ of approximately 10 wt %. However, at such an amount of $SnO_2$, the plasma wavelength shifts to a shorter wavelength side, increasing absorptivity in the infrared region.

On the other hand, there is an attempt to attain desired properties by adding an element to indium oxide. For example, Patent Literature 1 discloses an oxide sintered body including indium, at least one element selected from a plurality of metal elements, and oxygen, wherein the content of the selected metal element is 2.0 to 40 at %. In Patent Literature 1, examples of the plurality of metal elements include zirconium and yttrium together with other elements. However, Patent Literature 1 only discloses the oxide sintered body to which the above metal element was added singly. Patent Literature 1 only discloses a composition having a ratio of zirconium of 16.9 at % and a composition having a ratio of yttrium of 17.4 at %.

CITATION LIST

Patent Literature

Patent Literature 1: Japanese Patent Application Laid-Open No. 09-209134

Non Patent Literature

Non Patent Literature 1: TOSOH Research & Technology Review, 47, pp. 11-20 (2003)

SUMMARY OF INVENTION

Technical Problem

In applications for which the optical properties are important, such as the electrode for the liquid crystal displaying element and the electrode for a variety of light receiving elements in the solar cell, an electrode having lower light absorption properties over a wide region of wavelength is demanded. Namely, it is desired that two properties, low resistivity and low light absorptivity, are satisfied at the same time. Then, as one aspect of the present invention, an object of the present invention is to provide a complex oxide sintered body that can provide a transparent conductive oxide film having sufficiently low light absorptivity over a wide region of wavelength and low resistivity. As another aspect of the present invention, another object of the present invention is to provide a transparent conductive oxide film having sufficiently low light absorptivity over a wide region of wavelength and low resistivity.

Solution to Problem

In consideration of such circumstances, the present inventors conducted an extensive research. As a result, it was found that a complex oxide sintered body that enables formation of a transparent conductive oxide film that can satisfy sufficiently low light absorptivity and low resistivity at the same time can be attained by adding a specific element to indium oxide at a specific ratio, and the present invention has been completed.

The present invention provides a complex oxide sintered body wherein $Zr/(In+Zr+Y)$ is 0.05 to 4.5 at %, and $Y/(In+Zr+Y)$ is 0.005 to 0.5 at % in an atomic ratio when indium, zirconium, and yttrium are designated by In, Zr, and Y, respectively.

The present invention provides a sputtering target including the above complex oxide sintered body. The present invention provides a method for producing a transparent conductive oxide film wherein sputtering is performed using the above sputtering target.

The present invention provides a transparent conductive oxide film obtained by the method above.

The present invention provides a transparent conductive oxide film wherein $Zr/(In+Zr+Y)$ is 0.05 to 4.5 at %, and $Y/(In+Zr+Y)$ is 0.005 to 0.5 at % in an atomic ratio when indium, zirconium, and yttrium are designated by In, Zr, and Y, respectively.

Advantageous Effects of Invention

The complex oxide sintered body according to the present invention can be used as a sputtering target. By sputtering using the sputtering target, the transparent conductive oxide film according to the present invention can be produced while abnormal discharge is being suppressed during sputtering. The transparent conductive oxide film according to the present invention has low resistance and low light absorption properties (low light absorptivity) over a wide region of wavelength.

For this reason, by using the complex oxide sintered body according to the present invention in the solar cell, for example, optical loss and heat to be generated by light absorption can be suppressed more significantly than in the conventional solar cell. Thereby, a stable solar cell having high photoelectric conversion efficiency can be provided. The solar cell here refers to a solar cell using a transparent conductive oxide film. Examples of such a solar cell include silicon solar cells using single-crystal silicon, polycrystalline silicon, or amorphous silicon; compound solar cells such as $CuInSe_2$, $Cu(In, Ga)Se_2$, GaAs, or CdTe; and dye sensitized solar cells.

BRIEF DESCRIPTION OF DRAWINGS

FIG. 1 is a perspective view showing an embodiment of an oxide sintered body according to the present invention.

DESCRIPTION OF EMBODIMENTS

Hereinafter, a suitable embodiment according to the present invention will be described in more detail.

FIG. 1 is a perspective view of an oxide sintered body 10 according to the present embodiment. It is preferable that the complex oxide sintered body (sintered complex oxide) 10 according to the present embodiment contain a complex oxide containing indium, zirconium, yttrium, and oxygen as constitutional elements. The complex oxide sintered body 10 may contain the above complex oxide and indium oxide. The complex oxide sintered body 10 may be a complex oxide sintered body consisting of the above complex oxide.

In the complex oxide sintered body 10 according to the present embodiment, Zr/(In+Zr+Y) is 0.05 to 4.5 at %, and Y/(In+Zr+Y) is 0.005 to 0.5 at % when indium, zirconium, and yttrium are designated by In, Zr, and Y, respectively. Herein, "at %" means "atomic %." Namely, in the complex oxide sintered body 10 according to the present embodiment, the atomic ratio (ratio in the atomic number) of Zr to the total of In, Zr, and Y is 0.05 to 4.5 at %, and the atomic ratio (ratio in the atomic number) of Y to the total of In, Zr, and Y is 0.005 to 0.5 at %.

At such ranges of the composition, a transparent conductive oxide film having low resistance and low light absorptivity over a wide region of wavelength can be formed. The lower limit of Zr/(In+Zr+Y) is preferably 0.1 at % from the viewpoint of further reducing the light absorptivity of the transparent conductive oxide film. From the same viewpoint, the upper limit of Zr/(In+Zr+Y) is preferably 2.8 at %, and more preferably 1.95 at %.

From the viewpoint of further reducing the light absorptivity of the transparent conductive oxide film, the lower limit of Y/(In+Zr+Y) is preferably 0.01 at %. From the same viewpoint, the upper limit of Y/(In+Zr+Y) is preferably 0.4 at %, more preferably 0.3 at %, still more preferably 0.2 at %, and particularly preferably 0.14 at %.

In the present embodiment, Zr/(In+Zr+Y) is 0.05 to 1.95 at % from the viewpoint of satisfying low resistivity and low light absorptivity in the transparent conductive oxide film at the same time at a higher level. Y/(In+Zr+Y) is 0.005 to 0.14 at %.

The complex oxide sintered body 10 contains a complex oxide having indium, zirconium, yttrium, and oxygen as the contitituional elements. The content of indium in the complex oxide sintered body 10 is preferably 95 at % or more, more preferably 96 at % or more, and still more preferably 97 to 99.9 at % based on the total metal elements. The complex oxide sintered body 10 may contain indium oxide as a main component.

The content of zirconium in the complex oxide sintered body 10 is preferably 0.05 to 4.5 at %, and more preferably 0.05 to 1.95 at % based on the total metal elements. The content of yttrium in the complex oxide sintered body 10 is preferably 0.005 to 0.5 at %, and more preferably 0.005 to 0.14 at % based on the total of metal elements.

The complex oxide sintered body 10 and the transparent conductive oxide film according to the present embodiment may contain a slight amount of inevitable impurities. Examples of such impurities include compounds such as oxides having metal elements other than In, Zr, and Y. The total content of these impurities in the complex oxide sintered body 10 is preferably 1 at % or less, more preferably 0.5 at % or less, and still more preferably 0.1 at % or less in terms of the metal element based on the total of In, Zr, and Y.

The relative density of the complex oxide sintered body 10 according to the present embodiment is preferably 97% or more, and more preferably 99% or more. The complex oxide sintered body 10 having such a relative density can reduce abnormal discharge during sputtering more significantly when the complex oxide sintered body 10 is used as the sputtering target.

The relative density herein is calculated as follows. Namely, In, Zr, and Y are converted into oxides thereof, that is, $In_2O_3$, $ZrO_2$, and $Y_2O_3$, respectively, and the weight ratios thereof are determined. The determined weight ratios of $In_2O_3$, $ZrO_2$, and $Y_2O_3$ are designated by a (%), b (%), and c (%), respectively. Here, a, b, and c can be determined from the ratio in the raw material composition of a mixed powder for molding in production of the complex oxide sintered body 10, namely, the amounts of the respective oxide powders to be prepared.

Now, the true densities of the respective oxides are $In_2O_3$: 7.18 g/cm$^3$, $ZrO_2$: 6.00 g/cm$^3$, and $Y_2O_3$: 5.01 g/cm$^3$. Using the values of these true densities, the logical density A (g/cm$^3$) is calculated from the following formula:

$$A=(a+b+c)/((a/7.18)+(b/6.00)+(c/5.01))$$

On the other hand, the sintering density B (g/cm$^3$) of the complex oxide sintered body is measured by the Archimedian method according to JIS-R1634-1998.

From the following formula, the relative density (%) is determined as the relative value of the sintering density B (g/cm$^3$) to the logical density A (g/cm$^3$) arithmetically determined:

$$\text{Relative density (\%)}=(B/A)\times 100$$

The upper limit of the average particle size of particles that form the complex oxide sintered body 10 according to the present embodiment is preferably 10 μm or less, and more preferably 6 μm or less. At such an average particle size, the strength of the complex oxide sintered body 10 can be enhanced. The lower limit of the average particle size is preferably 0.01 μm, more preferably 0.5 μm, and still more preferably 2 μm from the viewpoint of easiness of production. Examples of the particles that form the complex oxide sintered body 10 include particles of complex oxides and/or particles of indium oxide.

Herein, the average particle size of the particles contained in the complex oxide sintered body 10 is measured by the following procedure. Namely, after the complex oxide sintered body 10 is cut into a proper size, the surface to be observed is polished. Next, the polished surface is subjected to chemical etching using a diluted hydrochloric acid solution to make the grain boundary clear. The etched surface of the complex oxide sintered body is observed with an EPMA, an SEM/EDS, an XRD or the like, and the photograph for observation is taken. The long diameters of 500 or more particles contained in the photograph for observation are measured by image processing. The arithmetic average value of the long diameters thus measured is defined as the average particle size.

Next, a suitable embodiment of the method for producing the complex oxide sintered body 10 will be described.

The production method according to the present embodiment includes a mixing step of preparing a mixed powder for molding which includes an indium source powder, a zirconium source powder, and a yttrium source powder, a molding step of molding the mixed powder into a molded body, and a sintering step of sintering the molded body to obtain the complex oxide sintered body 10. Hereinafter, the respective steps will be described in more detail.

In the mixing step, a mixed powder containing oxides of indium, zirconium, and yttrium is prepared. In the present embodiment, the method for mixing the raw material powders is not particularly limited. The indium source powder, the zirconium source powder, and the yttrium source powder may be mixed simultaneously, or part of these powders may be premixed, and the remaining thereof may be added and mixed.

As the mixing method, it is preferable that firstly the zirconium source powder and the yttrium source powder be premixed, and calcined. The raw material powder is not particularly limited, and examples thereof include zirconium oxide powder and yttrium oxide powder.

Instead of zirconium oxide powder and yttrium oxide, compounds to be turned into zirconium oxide and yttrium oxide by sintering may be used. Examples of such compounds include metal salts of zirconium and yttrium such as nitric acid salts, chlorides, or carbonates, or alkoxides thereof. Among these, considering handling properties, powder of oxides are suitably used. The average primary particle size of these powders is preferably 1.5 µm or less, and more preferably 0.1 to 1.5 µm from the viewpoint of handling properties. By use of such powders, the density of the complex oxide sintered body 10 can be further increased.

Here, when premixing is performed, the method is not particularly limited. Examples of the method include mixing methods such as dry and wet medium stirring milling using balls or beads made of zirconia, alumina, a nylon resin or the like; medium-less container rotary mixing; and mechanical stirring mixing. Specifically, examples thereof include a ball mill, a bead mill, an attritor, a vibration mill, a planetary mill, a jet mill, a V-type mixer, a paddle mixer, and a twin axial planetary stirring mixer.

When the ball mill, the bead mill, the attritor, the vibration mill, the planetary mill, the jet mill or the like, which are wet methods, are used, the slurry after crushing is dried. The drying method is not particularly limited, and examples thereof include filtration drying, fluidized layer drying, and spray drying. When a metal salt solution or an alkoxide solution is used as the raw material, it is preferable that products deposited from the solution be dried.

When premixing is performed, it is preferable that the obtained premixed powder be calcined at 800 to 1200° C. The calcining temperature is more preferably 1000 to 1200° C., and it is sufficient to calcine for 1 to 3 hours. It is preferable that the obtained calcined powder be made to have the average primary particle size of 0.5 µm or less by crushing treatment or the like. The treatment method such as crushing is not particularly limited, and examples thereof include mixing methods such as dry and wet medium stirring milling using balls or beads made of zirconia, alumina, a nylon resin or the like. Specifically, examples thereof include a ball mill, a bead mill, an attritor, a vibration mill, a planetary mill, and a jet mill. When the ball mill, the bead mill, the attritor, the vibration mill, the planetary mill, the jet mill or the like, which are wet methods, are used, the slurry after crushing is dried. The drying method is not particularly limited, and examples thereof include filtration drying, fluidized layer drying, and spray drying.

Next, the indium oxide powder is mixed with the crushed, calcined powder so as to obtain a desired final composition, and a mixed powder for molding is obtained. Using the indium oxide powder, complication in the steps and accompanying work such as treatment of the powder can be reduced. When the indium source is a substance other than an oxide such as a nitric acid salt, a chloride, or a carbonate thereof, the substance is calcined to form an oxide, and used. The average primary particle size of these powders is preferably 1.5 µm or less, and more preferably 0.1 to 1.5 µm considering handling properties. Using the powder having such a particle size, the density of the complex oxide sintered body 10 can be further increased.

Here, the method for mixing the indium oxide powder with the calcined powder is not particularly limited, and examples thereof include mixing methods such as dry and wet medium stirring milling using balls or beads made of zirconia, alumina, a nylon resin or the like; medium-less container rotary mixing; and mechanical stirring mixing. Specifically, examples thereof include a ball mill, a bead mill, an attritor, a vibration mill, a planetary mill, a jet mill, a V-type mixer, a paddle mixer, and a twin axial planetary stirring mixer. When the ball mill, the bead mill, the attritor, the vibration mill, the planetary mill, the jet mill or the like, which are wet methods, are used, the slurry after crushing is dried. The drying method is not particularly limited, and examples thereof include filtration drying, fluidized layer drying, and spray drying.

The granulation treatment and the like of the obtained mixed powder for molding can be performed to improve operationability in the molding step. By these operations, molding properties and sintering properties can be further improved.

It is preferable that in the mixing step, the amounts of the indium source powder, the zirconium source powder, and the yttrium source powder to be used fall within the following ranges when the composition of the mixed powder for molding (final composition) is expressed by the atomic ratio of the metal elements. Namely, $Zr/(In+Zr+Y)$ is 0.05 to 4.5 at %, and $Y/(In+Zr+Y)$ is 0.005 to 0.5 at %. Preferably, $Zr/(In+Zr+Y)$ is 0.05 to 1.95 at %, and $Y/(In+Zr+Y)$ is 0.005 to 0.14 at %.

At such a composition range, a transparent conductive oxide film having low resistance and low light absorption properties over a wide region of wavelength can be attained.

In the molding step, the mixed powder for molding obtained in the mixing step is molded. The molding method that enables molding into a target shape can be properly selected, and the molding method is not particularly limited. Examples thereof include a press molding method and a cast molding method. The molding pressure can be properly selected in the range in which a molded body that does not crack and can be handled can be produced, and is not particularly limited. It is preferable that the molding density of the molded body be as high as possible. For this, a method such as cold isostatic pressing (CIP) can be used. At this time, organic additives may be used when necessary to improve molding properties.

When additives are used in molding, it is preferable that to remove the moisture content and the organic additives remaining in the molded body, a heat treatment be performed at a temperature of 80 to 500° C. before the sintering step. The treatment temperature may be properly selected according to the amounts and kinds of the remaining moisture content and additives.

In the sintering step, the molded body obtained in the molding step is sintered. The temperature raising rate is not particularly limited, and is preferably 10 to 400° C./hour from the viewpoint of reduction in the sintering time and prevention of cracking. The retention temperature for sintering (sintering retention temperature) is preferably 1400° C. or more and less than 1650° C., and more preferably 1500° C. or more and 1625° C. or less. Under such sintering conditions, a complex oxide sintered body having a higher density can be obtained. The retention time is preferably 1 hour or more, and more preferably 3 to 10 hours. Thereby, the complex oxide sintered body 10 having a higher density and a smaller average particle size of particles can be obtained. The temperature falling rate is not particularly limited as long as the temperature falling rate is set within the standard range, and is preferably 10 to 500° C./hour from the viewpoint of reduction in the sintering time and prevention of cracking.

It is preferable that the atmosphere during sintering be an atmosphere containing oxygen. Particularly, it is preferable to sinter in an oxygen stream. Particularly, it is preferable that the ratio of the weight of the molded body (amount charged, kg) to the oxygen flow rate (L/min) during introduction of oxygen into a furnace during sintering (weight of molded body/oxygen flow rate) be 1.0 [kg/(L/min)] or less. Thereby, the complex oxide sintered body 10 having a higher density can be obtained.

The method for producing the complex oxide sintered body according to the present invention is not limited to the above method. For example, in the mixing step, without performing premixing and calcination, the indium source powder, the zirconium source powder, and the yttrium source powder may be mixed in batch to prepare the mixed powder for molding.

The sputtering target according to the present embodiment includes the complex oxide sintered body above. Such a sputtering target is excellent in discharge properties during formation of the film, and can suppress abnormal discharge, stably forming the film. The sputtering target has the same composition and crystal structure as those of the complex oxide sintered body 10.

In the present embodiment, the complex oxide sintered body 10 may be used as it is as the sputtering target, or the complex oxide sintered body 10 may be processed into a predetermined shape and then be used as the sputtering target.

The surface roughness of the surface to be sputtered of the sputtering target is preferably 3 μm or less, and more preferably 2 μm or less in terms of a center line average roughness (Ra). Thereby, the number of abnormal discharge during formation of the film can be further suppressed, enabling stable formation of the film. The center line average roughness can be adjusted by the method including machining the surface of the complex oxide sintered body, which is the surface to be sputtered, with any of grinding wheels having different grinding wheel number, or the like, or by a method for spray processing the surface of the complex oxide sintered body by sand blasting or the like. The center line average roughness can be determined by evaluating the surface to be measured with a surface property measurement apparatus, for example.

Using the sputtering target according to the present embodiment, the film can be formed by the sputtering method. As the sputtering method, a DC sputtering method, an RF sputtering method, an AC sputtering method, a DC magnetron sputtering method, an RF magnetron sputtering method, an ion beam sputtering method or the like can be properly selected. Among these, the DC magnetron sputtering method, and RF magnetron sputtering method are preferable because a film with a large area can be formed uniformly at a high speed.

The temperature during sputtering is not particularly limited, and is set properly according to the heat resistance of the base material to be used. For example, when an alkali-free glass is used as the base material, it is preferable that the temperature be usually 250° C. or less. When a resin film is used as the base material, it is preferable that the temperature be usually 150° C. or less. When a base material excellent in heat resistance such as quartz, ceramics, or metals is used, the film can be formed at a temperature equal to or more than the above-described temperatures.

For the atmosphere gas during sputtering, usually an inert gas such as argon gas is used. When necessary, oxygen gas, nitrogen gas, or hydrogen gas may be used, for example.

The transparent conductive oxide film according to the present embodiment can be obtained by forming the film by sputtering using the above sputtering target. Namely, the transparent conductive oxide film according to the present embodiment can be obtained by performing the step of sputtering the sputtering target including the complex oxide sintered body 10 to form the film.

The transparent conductive oxide film according to the present embodiment has low resistivity and low light absorptivity over a wide region of wavelength. For example, in the transparent conductive oxide film according to the present embodiment, an average value of light absorptivity at a wavelength of 400 to 600 nm is less than 3%. An average value of light absorptivity at a wavelength of 800 to 1200 nm is less than 2%.

The composition of the target used in sputtering is reflected in the composition of the transparent conductive oxide film obtained by the above method. Namely, by using the sputtering target including the above complex oxide sintered body 10, a transparent conductive oxide film wherein $Zr/(In+Zr+Y)$ is 0.05 to 4.5 at % and $Y/(In+Zr+Y)$ is 0.005 to 0.5 at % is obtained. Namely, the transparent conductive oxide film according to the present embodiment has the composition similar to that of the sputtering target and that of the complex oxide sintered body 10.

Accordingly, the transparent conductive oxide film includes a complex oxide having indium, zirconium, yttrium, and oxygen as constitutional elements. Preferable ranges of the content of indium, the content of zirconium, and the content of yttrium in the transparent conductive oxide film are the same as those in the complex oxide sintered body 10. The transparent conductive oxide film may contain indium oxide as a main component.

The lower limit of $Zr/(In+Zr+Y)$ is preferably 0.1 at % from the viewpoint of further reducing the light absorptivity of the transparent conductive oxide film according to the present embodiment. From the same viewpoint, the upper limit of $Zr/(In+Zr+Y)$ is preferably 2.8 at %, and more preferably 1.95 at %.

The lower limit of $Y/(In+Zr+Y)$ is preferably 0.01 at % from the viewpoint of further reducing the light absorptivity of the transparent conductive oxide film according to the present embodiment. From the same viewpoint, the upper limit of $Y/(In+Zr+Y)$ is preferably 0.4 at %, more preferably 0.3 at %, still more preferably 0.2 at %, and particularly preferably 0.14 at %.

In the present embodiment, from the viewpoint of satisfying low resistivity and low light absorptivity of the transparent conductive oxide film at a higher level, it is preferable that in the transparent conductive oxide film, Zr/(In+Zr+Y) be 0.05 to 1.95 at %, and Y/(In+Zr+Y) be 0.005 to 0.14 at %.

The transparent conductive oxide film is used in a film thickness suitable for applications. For example, when the transparent conductive oxide film is used for an electrode and the like in a variety of light receiving elements in the solar cell and the like, a transparent conductive oxide film having a film thickness of approximately 100 to 300 nm is often used. In applications of displaying elements such as liquid crystal displaying elements, particularly touch screens, a flexible substrate using a polymer film is often employed. In this case, the transparent conductive oxide film is used as a very thin film having a film thickness of approximately 5 to 50 nm. To use the polymer film, the highest temperature for the film forming process needs to be controlled to be a low temperature.

As above, the suitable embodiment according to the present invention has been described, but the present invention is not limited to the above embodiment.

EXAMPLES

The present invention will be more specifically described with reference to Examples below, but the present invention is not limited to these Examples.

Examples 1 to 10, Comparative Examples 1 to 8

Production of Complex Oxide Sintered Body

As the raw material powders, an indium oxide powder having a purity of 99.99% by weight and an average particle size of 0.5 μm, a zirconium oxide powder having a purity of 99.9% by weight and an average particle size of 0.2 μm, and a yttrium oxide powder having a purity of 99.9% by weight and an average particle size of 0.2 μm were provided. These raw material powders were weighed so as to satisfy the atomic ratio shown in Table 2, and were mixed with a dry ball mill to obtain a mixed powder for molding. The average particle size of the mixed powder was 0.2 μm.

The mixed powder was molded by the following procedure to produce a molded body. First, using a metal mold having a diameter of 150 mm, the mixed powder was molded under increased pressure at 0.3 ton/cm². Next, CIP molding was performed under increased pressure at 3.0 ton/cm² to obtain a cylindrical molded body. The molded body was placed in a sintering furnace whose atmosphere was adjusted to a pure oxygen atmosphere, and was sintered under the following conditions to produce a cylindrical complex oxide sintered body. Thus, complex oxide sintered bodies of Examples and Comparative Examples were obtained. The retention time means the time during which the sintering temperature is kept. The sintering temperature is the retention temperature.

(Sintering Conditions)
Temperature raising rate: 50° C./hour
Sintering temperature: 1600° C.
Retention time: 5 hours
Sintering atmosphere: pure oxygen gas was introduced into the furnace during a period before start of temperature raising (room temperature) to a time when the temperature reaches 100° C. during lowering the temperature
Temperature falling rate: 100° C./hour
Weight of molded body/oxygen flow rate: 0.9 [kg/(L/min)]

<Evaluation of Complex Oxide Sintered Body>
(Composition)

The compositions of the complex oxide sintered bodies of Examples and Comparative Examples were quantified by an ICP light emission analysis method using a commercially available ICP light emission analyzer. Then, the atomic ratios were determined. The results are shown in Table 2. The compositions of the complex oxide sintered bodies were substantially the same as the compositions of the mixed powders for molding.

(Relative Density)

The relative densities of the complex oxide sintered bodies of Examples and Comparative Examples were determined. The relative density is a value determined by the following formula wherein the logical density of the complex oxide sintered body is A, and the sintering density is B. The method for measuring the logical density A and the sintering density B is as described above. The results of measurement are shown in Table 2.

Relative density (%)=(B/A)×100

(Average Particle Size)

The average particle sizes of particles that formed the complex oxide sintered bodies of Examples and Comparative Examples were measured. The method for measuring the average particle size is as described above. The photograph for observing the polished surface of the complex oxide sintered body (magnification: 1000 to 5000 times) was taken using a scanning electron microscope. In the photograph for observation, the long diameters of 500 particles were determined. The arithmetic average value of the determined long diameter was defined as the average particle size. The results of measurement are shown in Table 2.

<Production of Sputtering Target and Transparent Conductive Oxide Film>

The complex oxide sintered bodies produced in Examples and Comparative Examples were processed into a cylindrical shape (diameter: 4 inches=101.6 mm). The surface serving as the surface to be sputtered when being used as the sputtering target was polished using a flat surface grinder and a diamond grinding wheel. The center line average roughness (Ra) was adjusted by changing grinding wheel numbers during polishing. Thus, a sputtering target was produced. Ra of the surface to be sputtered of the produced sputtering target was measured using a commercially available surface property measurement apparatus (apparatus name: Surftest SV-3100, made by Mitutoyo Corporation). The results of measurement are shown in Table 2.

Using the obtained sputtering target, a film was formed on a substrate by the DC magnetron sputtering method under the following conditions. After film formation, a post treatment was performed under the following condition to obtain a transparent conductive oxide film.

(Film Forming Conditions)
Apparatus: DC magnetron sputtering apparatus
Magnetic field strength: 1000 Gauss (immediately above the target, horizontal component)
Substrate temperature: room temperature (25° C.)
Degree of vacuum to be reached: $5 \times 10^{-4}$ Pa
Atmosphere during film formation: argon gas+oxygen gas
The ratio of oxygen gas to the total of argon gas and oxygen gas (in terms of the volume) was as shown in "Atmosphere during film formation" in Table 2.
Gas pressure during sputtering: 0.5 Pa
DC power: 200 W
Film thickness: 150 nm
Substrate: alkali-free glass (made by Corning Incorporated, trade name: EAGLE XG glass, thickness: 0.7 mm)

(Conditions for Post Treatment after Film Formation)

After film formation, a heat treatment of heating the film in the air at 190° C. for 5 minutes was performed. Thus, a sample on which a transparent conductive oxide film was formed on a substrate was obtained. The evaluation of the transparent conductive oxide film described below was performed.

<Evaluation of Transparent Conductive Oxide Film>
(Light Absorptivity)

The light transmittance and light reflectance of the sample on which the transparent conductive oxide film was formed on a substrate were measured as follows. First, using a spectrophotometer (trade name: U-4100, made by Hitachi, Ltd.), the light transmittance and light reflectance at a wavelength in the range of 240 nm to 2600 nm were measured. The light absorptivity A (%) was determined from the following formula wherein the measured light transmittance was T (%) and the light reflectance was R (%).

$$A (\%) = 100 - T (\%) - R (\%)$$

The average value of the light absorptivity A (%) at a wavelength of 400 to 600 nm and the average value of the light absorptivity A (%) at a wavelength of 800 to 1200 nm were determined. The results are shown in Table 2.

(Resistivity)

The resistivity of the thin transparent conductive oxide film was measured using a commercially available measurement apparatus (trade name: HL5500, made by Japan Bio-Rad Laboratories, Inc.). The results of measurement are shown in Table 2.

Examples 11 to 15

Production of Complex Oxide Sintered Body

Complex oxide sintered bodies were produced in the same manner as in Example 2 except that the sintering conditions were changed as in Table 1. Thus, complex oxide sintered bodies of Examples 11 to 15 were obtained. Other sintering conditions not shown in Table 1 were the same as those in Example 2.

TABLE 1

| | Sintering temperature (° C.) | Retention time (hours) |
|---|---|---|
| Example 11 | 1600 | 15 |
| Example 12 | 1600 | 25 |
| Example 13 | 1625 | 5 |
| Example 14 | 1550 | 25 |
| Example 15 | 1500 | 25 |

<Production and Evaluation of Sputtering Target and Transparent Conductive Oxide Film>

Using the obtained complex oxide sintered bodies in Examples, sputtering targets were produced and transparent conductive oxide films were obtained, in the same manner as in Example 1. The evaluation of the complex oxide sintered body and transparent conductive oxide film was performed in the same manner as in Example 1. The results of evaluation are shown in Table 2.

Reference Example 1

Production and Evaluation of Complex Oxide Sintered Body, Sputtering Target and Transparent Conductive Oxide Film As the raw material powders, an indium oxide powder having a purity of 99.99% by weight and an average particle size of 0.5 μm, and a tin oxide powder having a purity of 99.99% by weight and an average particle size of 0.5 μm were provided. These powders were weighed so as to satisfy a weight ratio of indium oxide to tin oxide of 97:3, and were mixed with a dry ball mill to prepare a mixed powder for molding. The average particle size of the mixed powder was 0.2 μm.

Using the obtained mixed powder for molding, a complex oxide sintered body, a sputtering target, and a transparent conductive oxide film were obtained in the same manner as in Example 1. The evaluations of these were performed in the same manner as in Example 1. The results of evaluation are shown in Table 2.

TABLE 2

| | Complex oxide sintered body | | | | Transparent conductive oxide film | | | | |
|---|---|---|---|---|---|---|---|---|---|
| | Atomic ratio (at %) | | Relative density (%) | Average particle size (μm) | Sputtering target Ra | Atmosphere during film formation $O_2/(Ar + O_2)$ | Resistivity ($\Omega/\square$) | Light absorptivity (%) | |
| | Zr/ (In + Zr + Y) | Y/ (In + Zr + Y) | | | | | | Wavelength 400-600 nm | Wavelength 800-1200 nm |
| Example 1 | 0.10 | 0.01 | 99.2 | 6.8 | 0.42 | 0.020 | 22.5 | 1.8 | 1.6 |
| Example 2 | 0.35 | 0.02 | 99.2 | 6.5 | 0.42 | 0.020 | 20.2 | 1.6 | 1.4 |
| Example 3 | 0.75 | 0.05 | 99.2 | 6.5 | 0.42 | 0.020 | 21.3 | 1.2 | 0.7 |
| Example 4 | 1.40 | 0.10 | 99.1 | 5.2 | 0.42 | 0.015 | 19.0 | 1.7 | 1.1 |
| Example 5 | 1.68 | 0.12 | 99.2 | 5.4 | 0.42 | 0.015 | 18.6 | 1.7 | 1.2 |
| Example 6 | 1.95 | 0.15 | 99.2 | 5.3 | 0.42 | 0.010 | 18.4 | 2.3 | 0.9 |
| Example 7 | 2.80 | 0.20 | 99.4 | 4.8 | 0.42 | 0.010 | 22.7 | 2.4 | 0.9 |
| Example 8 | 0.10 | 0.40 | 99.3 | 3.8 | 0.41 | 0.020 | 23.8 | 1.8 | 1.6 |
| Example 9 | 4.40 | 0.01 | 99.1 | 3.5 | 0.41 | 0.010 | 25.0 | 2.4 | 1.6 |
| Example 10 | 4.40 | 0.40 | 99.1 | 3.4 | 0.41 | 0.010 | 26.8 | 2.4 | 1.2 |
| Example 11 | 0.35 | 0.02 | 99.3 | 8.8 | 0.42 | 0.020 | 20.2 | 1.6 | 1.4 |
| Example 12 | 0.35 | 0.02 | 99.3 | 12.2 | 0.43 | 0.020 | 20.2 | 1.6 | 1.4 |
| Example 13 | 0.35 | 0.02 | 99.3 | 16.4 | 0.44 | 0.020 | 20.2 | 1.6 | 1.4 |
| Example 14 | 0.35 | 0.02 | 97.6 | 6.0 | 0.42 | 0.020 | 20.2 | 1.6 | 1.4 |
| Example 15 | 0.35 | 0.02 | 93.8 | 3.4 | 0.41 | 0.020 | 20.2 | 1.6 | 1.4 |

TABLE 2-continued

|  | Complex oxide sintered body | | | | | Transparent conductive oxide film | | | |
| --- | --- | --- | --- | --- | --- | --- | --- | --- | --- |
|  | Atomic ratio (at %) | | Relative density (%) | Average particle size (μm) | Sputtering target Ra | Atmosphere during film formation $O_2/(Ar + O_2)$ | Resistivity (Ω/□) | Light absorptivity (%) | |
|  | Zr/ (In + Zr + Y) | Y/ (In + Zr + Y) | | | | | | Wavelength 400-600 nm | Wavelength 800-1200 nm |
| Comparative Example 1 | 0 | 0 | 99.0 | 8.2 | 0.42 | 0.020 | 24.8 | 3.4 | 2.0 |
| Comparative Example 2 | 0.02 | 0.002 | 99.1 | 7.0 | 0.42 | 0.020 | 24.3 | 3.1 | 2.0 |
| Comparative Example 3 | 0.02 | 0.20 | 99.1 | 7.0 | 0.42 | 0.020 | 23.9 | 3.3 | 2.1 |
| Comparative Example 4 | 0.02 | 0.55 | 99.1 | 7.2 | 0.42 | 0.020 | 23.5 | 3.6 | 2.1 |
| Comparative Example 5 | 5.00 | 0.002 | 99.1 | 6.6 | 0.42 | 0.010 | 30.3 | 4.0 | 2.2 |
| Comparative Example 6 | 5.00 | 0.20 | 99.2 | 6.3 | 0.42 | 0.010 | 32.5 | 4.3 | 2.2 |
| Comparative Example 7 | 5.00 | 0.55 | 99.3 | 6.1 | 0.42 | 0.010 | 33.5 | 4.6 | 2.2 |
| Comparative Example 8 | 1.95 | 0.55 | 99.3 | 6.0 | 0.42 | 0.010 | 32.4 | 3.8 | 2.1 |
| Reference Example 1 | 0 | 0 | 99.0 | 6.8 | 0.42 | 0.010 | 29.2 | 2.7 | 4.4 |

Comparing Examples 1 to 15 to Comparative Examples 1 to 8, it was found in Examples 1 to 15 that transparent conductive oxide films of which light absorptivity is reduced to less than 3% over a wide region of wavelength are obtained.

The transparent conductive oxide film according to Reference Example 1 corresponds to the film formed using an ITO material mainly used at present. It was found that absorptivity can be reduced over a wide region of wavelength in Examples 1 to 15 more significantly than in Reference Example 1.

Examples 16 to 18, Comparative Examples 9 to 12

Production and Evaluation of Complex Oxide Sintered Body, Sputtering Target, and Transparent Conductive Oxide Film In the solar cell that receives and uses sunlight, it is also preferable that photoelectric conversion efficiency be further improved by effectively using the sunlight. To use the sunlight more effectively, it is preferable that in addition of reducing light absorption properties as above, the sunlight energy in a region of wavelength not used, among the region of wavelength of the sunlight energy, be used. Namely, if the light in the ultraviolet region which does not transmit through the transparent conductive film can be converted into the light in the visible region by properties of the transparent conductive film serving as the surface electrode, higher photoelectric conversion efficiency can be obtained.

Accordingly, to evaluate the performance of transparent conductive oxide film relating to the conversion the wavelength of sunlight, a complex oxide sintered body was produced and the evaluation was performed as follows.

A complex oxide sintered body was produced in the same manner as in Example 1 except that raw material powders were blended so as to satisfy an atomic ratio shown in Table 3 in the complex oxide sintered body. Thus, complex oxide sintered bodies of Examples 16 to 18 and Comparative Examples 9 to 12 shown in Table 3 were obtained. Using the obtained complex oxide sintered bodies of Examples and Comparative Examples, sputtering targets were produced in the same manner as in Example 1 to obtain transparent conductive oxide films. The properties of the complex oxide sintered bodies, sputtering targets, and transparent conductive oxide films in Examples and Comparative Examples were evaluated in the same manner as in Example 1. The results of evaluation are shown in Table 3.

Reference Example 2

Production and Evaluation of Complex Oxide Sintered Body, Sputtering Target, and Transparent Conductive Oxide Film A complex oxide sintered body, a sputtering target, and a transparent conductive oxide film were produced in the same manner as in Reference Example 1. The properties of the complex oxide sintered body, the sputtering target, and the transparent conductive oxide film were evaluated in the same manner as in Example 1. The results of evaluation are shown in Table 3.

The relative value of fluorescence intensity in Table 3 was determined as follows. The light emission spectrum of the obtained transparent conductive oxide film was measured by photoluminescence spectroscopy using a spectrofluorophotometer (trade name: FP-6500, made by JASCO Corporation) under the following conditions.

Excitation light: xenon lamp (excited wavelength: 350 nm)

Temperature in measurement: room temperature (25° C.)

Detector: Si photodiode

In the obtained spectrum, the intensity of the highest peak at a wavelength in the range of 380 to 600 nm was determined. Wherein the intensity of the peak in Reference Example 2 was 1.0, the intensity of the peak in each of Examples and Comparative Examples was determined as the relative value of the intensity of the peak in Reference Example 2. The results are shown in Table 3.

TABLE 3

| | Complex oxide sintered body | | | | Transparent conductive oxide film | | | | |
|---|---|---|---|---|---|---|---|---|---|
| | Atomic ratio (at %) | | Relative density (%) | Average particle size (μm) | Sputtering target Ra | Atmosphere during film formation O$_2$/(Ar + O$_2$) | Resistivity (Ω/□) | Light absorptivity (%) | | Relative value of fluorescence intensity |
| | Zr/ (In + Zr + Y) | Y/ (In + Zr + Y) | | | | | | Wavelength 400-600 nm | Wavelength 800-1200 nm | |
| Example 16 | 0.75 | 0.05 | 99.2 | 6.5 | 0.42 | 0.020 | 21.3 | 1.2 | 0.7 | 1.34 |
| Example 17 | 1.40 | 0.10 | 99.1 | 5.2 | 0.42 | 0.015 | 19.0 | 1.7 | 1.1 | 1.38 |
| Example 18 | 1.68 | 0.12 | 99.2 | 5.4 | 0.42 | 0.015 | 18.6 | 1.7 | 1.2 | 2.01 |
| Comparative Example 9 | 0 | 0 | 99.0 | 8.2 | 0.42 | 0.020 | 24.8 | 3.4 | 2.0 | 0.86 |
| Comparative Example 10 | 0.02 | 0.002 | 99.1 | 7.0 | 0.42 | 0.020 | 24.3 | 3.1 | 2.0 | 1.05 |
| Comparative Example 11 | 1.50 | 0.00 | 99.1 | 6.0 | 0.42 | 0.020 | 44.8 | 1.8 | 3.0 | 1.11 |
| Comparative Example 12 | 1.68 | 0.00 | 99.2 | 5.8 | 0.42 | 0.020 | 43.2 | 1.9 | 3.2 | 1.15 |
| Reference Example 2 | 0 | 0 | 99.0 | 6.8 | 0.42 | 0.010 | 29.2 | 2.7 | 4.4 | 1.00 |

Comparing Examples 16 to 18 with Comparative Examples 9 to 12, the light at a wavelength in the ultraviolet region which does not transmit through the transparent conductive oxide film was converted into the light at a wavelength in the visible region which transmits through the transparent conductive oxide film thereby to be emitted more efficiently in Examples 16 to 18 than in Comparative Examples 9 to 12.

The transparent conductive oxide film according to Reference Example 2 corresponds to the film formed using an ITO material mainly used at present. The transparent conductive oxide films in Examples converted the light at a wavelength in the ultraviolet region which does not transmit through the transparent conductive oxide film into the light at a wavelength in the visible region which transmits through the transparent conductive oxide film thereby to emit more efficiently than the transparent conductive oxide film according to Reference Example 2 did.

Examples 19 to 22, Comparative Examples 13 to 15

Production and Evaluation of Complex Oxide Sintered Body, Sputtering Target, and Transparent Conductive Oxide Film In devices using a flexible substrate such as films, devices in which a plurality of materials are laminated and the like, the highest temperature in the film forming process needs to be controlled to be a low temperature. Then, a transparent conductive oxide film was produced under the film forming conditions at a low temperature, and film properties were evaluated as follows.

A complex oxide sintered body was produced in the same manner as in Example 1 except that raw material powders were blended so as to satisfy an atomic ratio shown in Table 4 in the complex oxide sintered body. Thus, complex oxide sintered bodies in Examples 19 to 22 shown in Table 4 were obtained. Using the obtained complex oxide sintered bodies of Examples and Comparative Examples, sputtering targets were produced in the same manner as in Example 1. The evaluation of the complex oxide sintered bodies and the sputtering targets were performed in the same manner as in Example 1. The results are shown in Table 4. The transparent conductive oxide films were obtained in the same manner as in Example 1 except that among the film forming conditions for the transparent conductive oxide film, the film thickness was 20 nm, the atmosphere during film formation was only argon gas, and post treatment conditions (heat treatment) after film formation was in the air at 170° C. for 60 minutes.

The resistivity of the transparent conductive oxide film was measured in the same manner as in Example 1. The results of measurement are shown in Table 4. The light transmittance of the transparent conductive oxide film is a value of the light transmittance obtained in the measurement of light absorptivity in Example 1. In Table 4, an average value of light transmittance at a wavelength of 400 to 800 nm, which is important for the displaying devices, was shown.

Reference Example 3

Production and Evaluation of Complex Oxide Sintered Body, Sputtering Target, and Transparent Conductive Oxide Film As the raw material powders, an indium oxide powder having a purity of 99.99% by weight and an average particle size of 0.5 μm and a tin oxide powder having a purity of 99.99% by weight and an average particle size of 0.5 μm were provided. These powders were weighed so as to satisfy a weight ratio of indium oxide to tin oxide of 95:5, and were mixed with a dry ball mill to prepare a mixed powder for molding. The average particle size of the mixed powder was 0.2 μm.

Using the obtained mixed powder for molding, a complex oxide sintered body, a sputtering target, and a transparent conductive oxide film were obtained in the same manner as in Example 19. The evaluations of these were performed in the same manner as in Example 19. The results of evaluation are shown in Table 4.

TABLE 4

| | Complex oxide sintered body | | | | | Transparent conductive oxide film | | |
|---|---|---|---|---|---|---|---|---|
| | Atomic ratio (at %) | | Relative density (%) | Average particle size (μm) | Sputtering target Ra | Atmosphere during film formation O$_2$/(Ar + O$_2$) | Resistivity (Ω/□) | Light absorptivity (%) Wavelength 400-800 nm |
| | Zr/ (In + Zr + Y) | Y/ (In + Zr + Y) | | | | | | |
| Example 19 | 0.80 | 0.03 | 99.1 | 6.1 | 0.42 | 0 | 183 | 89.7 |
| Example 20 | 1.30 | 0.04 | 99.2 | 6.5 | 0.42 | 0 | 157 | 89.8 |
| Example 21 | 1.90 | 0.12 | 99.2 | 5.3 | 0.42 | 0 | 130 | 90.1 |
| Example 22 | 2.40 | 0.15 | 99.3 | 6.0 | 0.42 | 0 | 196 | 90.3 |
| Comparative Example 13 | 0 | 0 | 99.0 | 8.2 | 0.42 | 0 | 260 | 88.0 |
| Comparative Example 14 | 0.02 | 0.002 | 99.1 | 7.0 | 0.42 | 0 | 230 | 88.1 |
| Comparative Example 15 | 5.00 | 0.20 | 99.2 | 6.3 | 0.42 | 0 | 241 | 89.5 |
| Reference Example 3 | 0 | 0 | 99.2 | 6.4 | 0.42 | 0 | 202 | 88.6 |

Comparing Examples 19 to 22 with Comparative Examples 13 to 15, in the film forming process at a low temperature, resistivity was lower and transmittance was higher in Example 19 to 22 than those in Comparative Examples 13 to 15. From this, it was found that Examples 19 to 22 have better properties than Comparative Examples 13 to 15.

The transparent conductive oxide film according to Reference Example 3 corresponds to the film formed using an ITO material mainly used in the film forming process at a low temperature at present. It was found that the transparent conductive oxide films of Examples 19 to 22 have lower resistivity and higher transmittance than those of the transparent conductive oxide film according to Reference Example 3.

INDUSTRIAL APPLICABILITY

According to the present invention, a sputtering target and a complex oxide sintered body suitably used as the sputtering target can be provided. By using the sputtering target and performing sputtering, a transparent conductive oxide film can be produced while abnormal discharge during sputtering is being suppressed. The transparent conductive oxide film according to the present invention has low resistance and low light absorptivity over a wide region of wavelength. For this reason, by using the transparent conductive oxide film according to the present invention for the solar cell, for example, optical loss and heat to be generated by light absorption can be suppressed more significantly than in the related art. Thereby, a stable solar cell having high photoelectric conversion efficiency can be provided. Moreover, the transparent conductive oxide film according to the present invention has low resistivity and high transmittance when being produced by the film forming process at a low temperature, and can be suitably used in applications of touch screens using a flexible substrate such as films, for example.

REFERENCE SIGNS LIST

10 . . . oxide sintered body.

The invention claimed is:

1. A complex oxide sintered body, wherein Zr/(In+Zr+Y) is 0.05 to 4.5 at % and Y/(In+Zr+Y) is 0.005 to 0.5 at % in an atomic ratio when indium, zirconium, and yttrium are designated by In, Zr, and Y, respectively, and
wherein the total content of the impurities having metal elements other than indium, zirconiuim, and yttrium is 1 at % or less in terms of the metal elements based on the total of indium, zirconium and yttrium.

2. The complex oxide sintered body according to claim 1, comprising a complex oxide having indium, zirconium, yttrium, and oxygen as constitutional elements.

3. A sputtering target comprising the complex oxide sintered body according to claim 2.

4. A method for producing a transparent conductive oxide film, comprising a step of sputtering using the sputtering target according to claim 3.

5. A transparent conductive oxide film obtained by the production method according to claim 4.

6. A sputtering target comprising the complex oxide sintered body according to claim 1.

7. A method for producing a transparent conductive oxide film, comprising a step of sputtering using the sputtering target according to claim 6.

8. A transparent conductive oxide film obtained by the production method according to claim 7.

9. The complex oxide sintered body according to claim 1, wherein the content of indium is 95 at % or more based on the total of indium, zirconium and yttrium.

10. A transparent conductive oxide film, wherein Zr/(In+Zr+Y) is 0.05 to 4.5 at % and Y/(In+Zr+Y) is 0.005 to 0.5 at % when indium, zirconium, and yttrium are designated by In, Zr, and Y, respectively,
wherein the total content of the impurities having metal elements other than indium, zirconiuim, and yttrium is 1 at % or less in terms of the metal elements based on the total of indium, zirconium and yttrium.

11. The transparent conductive oxide film according to claim 10, comprising a complex oxide having indium, zirconium, yttrium, and oxygen as constitutional elements.

12. The complex oxide sintered body according to claim 10, wherein the content of indium is 95 at % or more based on the total of indium, zirconium and yttrium.

* * * * *